Nov. 18, 1969 YUICHI HANETA 3,479,571

FIELD EFFECT SEMICONDUCTOR DEVICE

Filed Sept. 25, 1967

INVENTOR
YUICHI HANETA
BY
Hopgood & Calimafde
ATTORNEYS 3,479,571

FIELD EFFECT SEMICONDUCTOR DEVICE

Yuichi Haneta, Tokyo, Japan, assignor to Nippon Electric Company Limited, Tokyo, Japan, a corporation of Japan Filed Sept. 25, 1967, Ser. No. 670,082
Claims priority, application Japan, Sept. 28, 1966, 41/63,978
Int. Cl. H01l 3/04, 5/00
U.S. Cl. 317—234 2 Claims

ABSTRACT OF THE DISCLOSURE

A field effect semiconductor device in which a dielectric substance is sandwiched between two semiconductor materials, whereby a capacitance variation is obtained by impressing either a positive or a negative potential to one of the semiconductor materials.

Background of the invention

In field effect semiconductor devices known generally as metal-oxide semiconductor transistors or metal-oxide semiconductor diodes, a dielectric material is disposed between the semiconductor substrate and a gate electrode in order to improve the field effect. Electrons and positive holes are generated in the surface of the substrate at the boundary between the dielectric and semiconductor materials by impressing a voltage between the gate electrode and the substrate. The number of electrons and holes is controlled by the impressed voltage, and the conduction of the surface of the substrate side of said boundary is thus controlled and utilized for transistor or diode action.

The conventional field effect semiconductor device having such a dielectric material is manufactured by evaporating a metal gate electrode on the dielectric material formed on a semiconductor substrate. In the conventional device, as the result of forming the dielectric material, the electron density in the semiconductor substrate surface adjacent to the dielectric material becomes large by reason of the influence of said material. By impressing a negative voltage on the gate electrode, the electron density in the surface of the semiconductor substrate becomes small and finally, the electrons are replaced by positive holes. Accordingly, it is possible to control the electric current flowing in the substrate surface region properly and at the same time to vary the capacity to a large extent. On the other hand, when a positive voltage is impressed on the gate electrode, the electron density in said region does not vary, and therefore a current of a definite value always flows. Consequently, under this latter condition, the capacity is not varied by variations in the impressed voltage. Thus, it is seen that the conventional field effect device is only operable when impressing a negative voltage on the gate electrode.

Objects of the invention

It is an object of the present invention to provide a field effect semiconductor device which may be made operable by impressing either a positive or a negative voltage on a gate electrode thereof.

The above mentioned and other features and objects of this invention and the manner of attaining them will become more apparent and the invention itself will best be understood by reference to the following description of the invention taken in conjunction with the accompanying drawings.

Summary of the invention

The field effect device of this invention may be made by forming a layer of a dielectric material on a semiconductor substrate and then providing a further semiconductor material layer on the resultant dielectric material by the vapor growth method or any other suitable method to form a sandwich type structure. The field effect semiconductor device thus obtained is characterized in that a capacitance variation can be obtained by impressing either a positive or a negative voltage across the semiconductor material layer, the device performing as a field effect semiconductor device even when impressing a positive voltage.

Description of preferred embodiments

Figure 1:
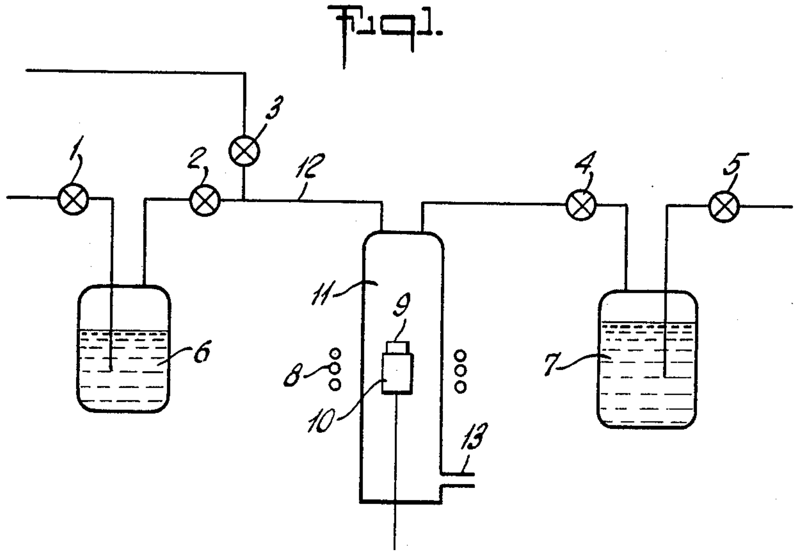
FIG. 1 is a schematic view of typical apparatus used for manufacturing a field effect semiconductor device according to this invention.

FIG. 1 shows apparatus for manufacturing a field effect semiconductor device of this invention. By opening a stop valve 3, hydrogen gas is made to flow into a reaction tube 11 through a pipe 12. After the initial gas within the reaction tube 11 is completely replaced by hydrogen, a semiconductor substrate 9 on a supporting member 10 is heated to a predetermined temperature, which may be of the order of 1200° C., by passing an electric current through a high frequency coil 8. Next, the reaction $$SiCl_4+2H_2O \rightarrow SiO_2+4HCl$$

is caused to occur in the reaction tube 11 by opening stop valves 1, 2, 4 and 5 and by introducing silicon tetrachloride ($SiCl_4$) from a silicon tetrachloride vessel 6 and also vapor of pure water ($H_2O$) from a pure water vessel 7, thus forming a silicon dioxide film of dielectric material. The thickness of the silicon dioxide film deposited on the semiconductor substrate 9 can be controlled by controlling the opening time of the stop valves 1, 2, 4 and 5. Upon the formation of a predetermined thickness of the oxide film, the stop valves 4 and 5 are closed, thereby stopping the flow of water vapor from the pure water vessel 7 into the reaction tube, and allowing only the inflow of silicon tetrachloride and hydrogen through the pipe 12, thus causing the reaction $SiCl_4+2H \rightarrow Si+4HCl$ in the reaction tube 11, which results in deposition of silicon on the silicon dioxide film. On this occasion, it is possible to deposit silicon having a predetermined impurity concentration by adding a proper amount of suitable impurity, such as phosphorus trichloride, boron tribromide, or the like, to the silicon tetrachloride.

Figure 2:
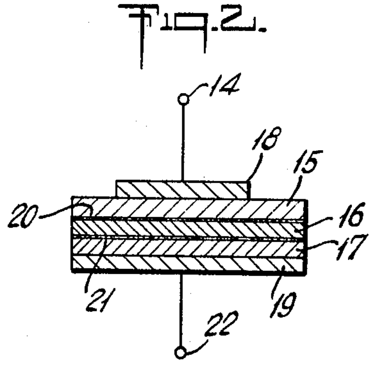
FIG. 2 is a cross-sectional view of a field effect semiconductor device made according to this invention.

FIG. 2 illustrates the field effect semiconductor device of this invention, which is manufactured according to the method described above. If the semiconductor substrate 17 of this device is made n-type with a resistivity greater than 1 Ω-cm., the electron density in the contact surface 21 becomes larger by the deposition of the silicon dioxide film 16 and becomes the $n^+$ type compared with the semiconductor substrate 17. Also, the contact surface 20 of the silicon 15 deposited on the silicon dioxide film 16 becomes the $n^+$ type due to the effect of the silicon dioxide film. Layers of metal 18 and 19 are then formed by evaporation, for the purpose of connecting electrode terminals 14 and 22.

Figure 3:
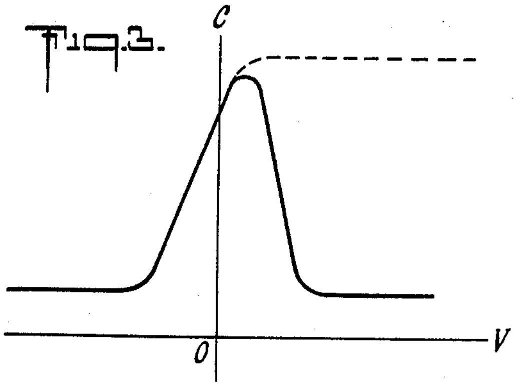
FIG. 3 is a graph of electrical characteristics of both a conventional field effect semiconductor device and the device of the present invention, showing the capacitance of the device as a function of applied voltage.

FIG. 3 indicates the relation between the capacity C and the applied voltage V of the field effect semiconductor device of this invention. The solid line indicates that the capacity decreases, when negative voltage is applied to the gate electrode 14, due to a decrease in the electron density in the contact surface 21, and that the capacity also decreases when positive voltage is applied, because of the electron density in the contact surface 20 being reduced by the application of positive voltage. In this manner, the capacity varies symmetrically by the applied voltage on the gate electrode 14, making the peak in the vicinity of zero voltage.

The dashed line in FIG. 3 indicates the relation between the capacity C and the applied voltage V, in a conventional field effect semiconductor device, wherein the variation of capacity when negative voltage is applied to the gate is similar to that of the device of the present invention, but wherein when positive voltage is applied, no variation occurs in capacity. As mentioned above, the device of this invention can be applied to a varactor diode and also to diodes of other types by causing it to operate in the vicinity of impressed zero voltage.

Figure 4:
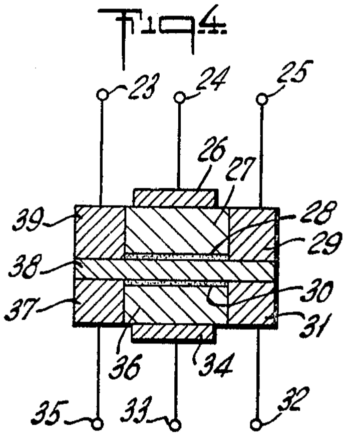
FIG. 4 is a cross-sectional view of another example of a field effect semiconductor device according to this invention.

FIG. 4 illustrates another example of a field effect semiconductor device of this invention. An n-type impurity is selectively diffused into a p-type semiconductor substrate 36 to form n-type layers 31 and 37, and then a silicon dioxide film 38 is grown on a semiconductor substrate to a predetermined thickness. After that, a p-type silicon layer 27 is formed on the oxide film, and n-type diffused regions 29 and 39 are formed in the p-type silicon layer by selective diffusion of an n-type immunity. The numerals 26 and 34 indicate metal electrodes, while 23, 24, 25, 32, 33 and 35 are electrode terminals. The contact surfaces 28 and 30 of the substrate and the silicon layer with the oxide film become n-type under the influence of the silicon dioxide film. When electric currents are made to flow between the electrode terminals 32 and 35 and between the terminals 23 and 25, respectively, and voltages are applied to the electrode terminals 24 and 33, the electron densities in the regions 28 and 30 are varied, thereby enabling control of the current flowing between the electrode terminals 32 and 35 and between the terminals 23 and 25. The fact that the electric currents flowing between the electrode terminals 23 and 25 and between the terminals 32 and 35 can be controlled by applying proper voltages to the electrode terminals 24 and 33 results from the two field effect semiconductor devices being formed within one structural element, said devices being related to each other. Accordingly, application of this teaching to various devices can be achieved by proper combinations of this type.

It is to be noted that besides silicon dioxide film as the dielectric material, other dielectric materials such as silicon nitride, to name but one, can also be used.

While the foregoing description sets forth the principles of the invention in connection with specific apparatus, it is to be understood that the description is made only by way of example and not as a limitation of the scope of the invention.

What is claimed is:

1. A variable capacitance semiconductor device comprising a sandwich-like structure having a layer of dielectric material and layers of semiconductor material of a first conductivity type located on each of opposite sides of the dielectric layer, the contact surfaces of said layers adjacent the dielectric material having a modified conductivity compared with the conductivity of said semiconductor layers, a layer of metal formed on the exposed outside of each layer of semiconductor material, the capacitance between said metal layers being decreased as a result of a decrease in the electron density in one of said contact surfaces upon the application of a negative potential to one of said metal layers, and the capacitance between said metal layers also being decreased as a result of a decrease in the electron density in the other of said contact surfaces upon the application of a positive potential to said one metal layer.

2. A compact semiconductor device comprising, a sandwich-like structure including a middle layer of dielectric material, layers of semiconductor material with a layer in contact with each of opposite sides of the dielectric layer, each of said layers of semiconductor materials being provided with a central semiconducting region of a first conductivity type and each central region being flanked by a pair of semiconductor regions of a second conductivity type opposite to the first conductivity, with each of said flanking semiconductor regions extending to contact the dielectric layer, and with each of said central region having an enriched first conductivity type region adjacent the dielectric layer, and means for coupling electrical signals to said semiconductor regions.

References Cited

UNITED STATES PATENTS

| | | | |
|---|---|---|---|
| 3,094,671 | 6/1963 | Garrett et al. | 317—234 |
| 3,159,780 | 12/1964 | Parks | 317—234 |
| 3,335,342 | 8/1967 | Leistiko et al. | 317—235 |
| 3,299,332 | 1/1967 | Saburi | 317—234 |
| 3,300,644 | 1/1967 | Zemel et al. | 317—234 |

OTHER REFERENCES

IBM Tech Discl. Bul., "Formation of Depletion and Enhancement Mode Field Effect Transistors" by Lehman et al., vol 8, No. 4, September 1965, pp. 675–76.

JOHN W. HUCKERT, Primary Examiner

J. D. CRAIG, Assistant Examiner

317—235, 238